United States Patent [19]

Pease et al.

[11] 4,151,515

[45] Apr. 24, 1979

[54] LOAD CONTROL APPARATUS

[75] Inventors: Hugh R. Pease, Saratoga; Franklin J. Agardy; Elliot Josephson, both of Los Altos, all of Calif.

[73] Assignee: Hutec Corporation, San Jose, Calif.

[21] Appl. No.: 850,604

[22] Filed: Nov. 11, 1977

[51] Int. Cl.² .................... H01H 7/00; H01H 43/00; H05B 37/02

[52] U.S. Cl. ................... 340/309.1; 307/141; 315/293; 340/693

[58] Field of Search ............ 340/147 R, 309.1, 309.4, 340/693; 307/140, 141; 315/291, 293, 360

[56] References Cited

U.S. PATENT DOCUMENTS

| | | | |
|---|---|---|---|
| 3,940,660 | 2/1976 | Edwards | 315/291 |
| 4,002,925 | 1/1977 | Monahan | 307/141 |
| 4,079,366 | 3/1978 | Wong | 340/309.1 |

*Primary Examiner*—Donald J. Yusko

*Attorney, Agent, or Firm*—Schatzel & Hamrick

[57] ABSTRACT

An improved load control apparatus for use in a two wire installation in which interconnection of the two wires is effective to energize a series connected load such as a light bulb, and including a power supply for developing a power supply potential and 60-Hz clocking pulses from energy obtained from the two wires, a coupler responsive to a command signal for alternately substantially preventing and permitting a light bulb energizing current to flow between the two wires and in both states for permitting energization of the power supply and a control logic energized by the power supply potential for counting the clocking pulses and for developing at preset times the coupler command signal whereby the switching apparatus in a first mode reduces energy consumption by turning off a light left on after business hours and, in a second mode by cycling a light in a predetermined pattern to discourage burglaries.

13 Claims, 9 Drawing Figures

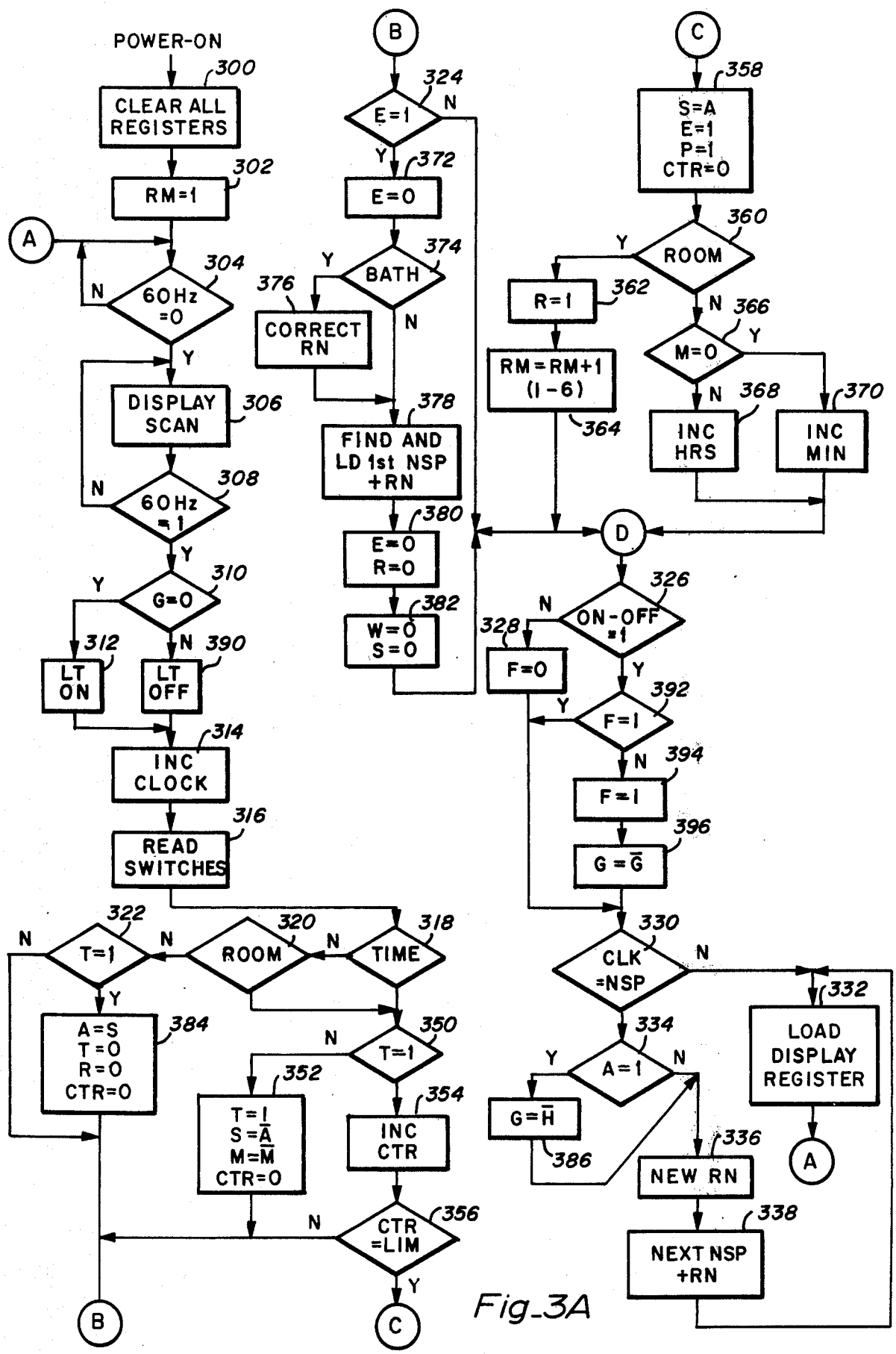
Fig_3A

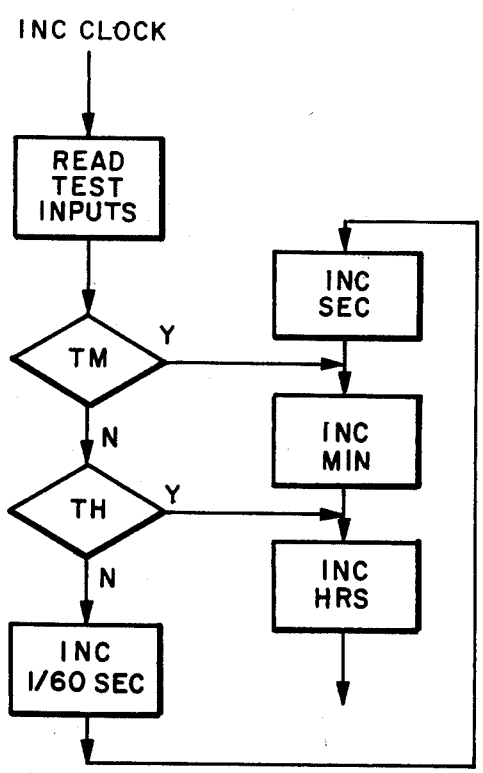
Fig_3B
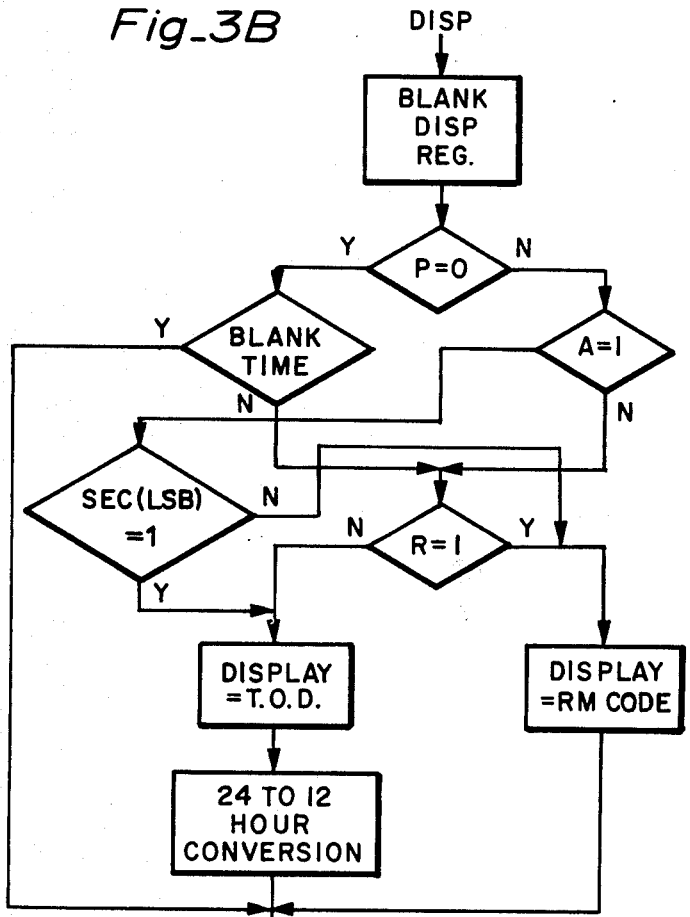
Fig_3D
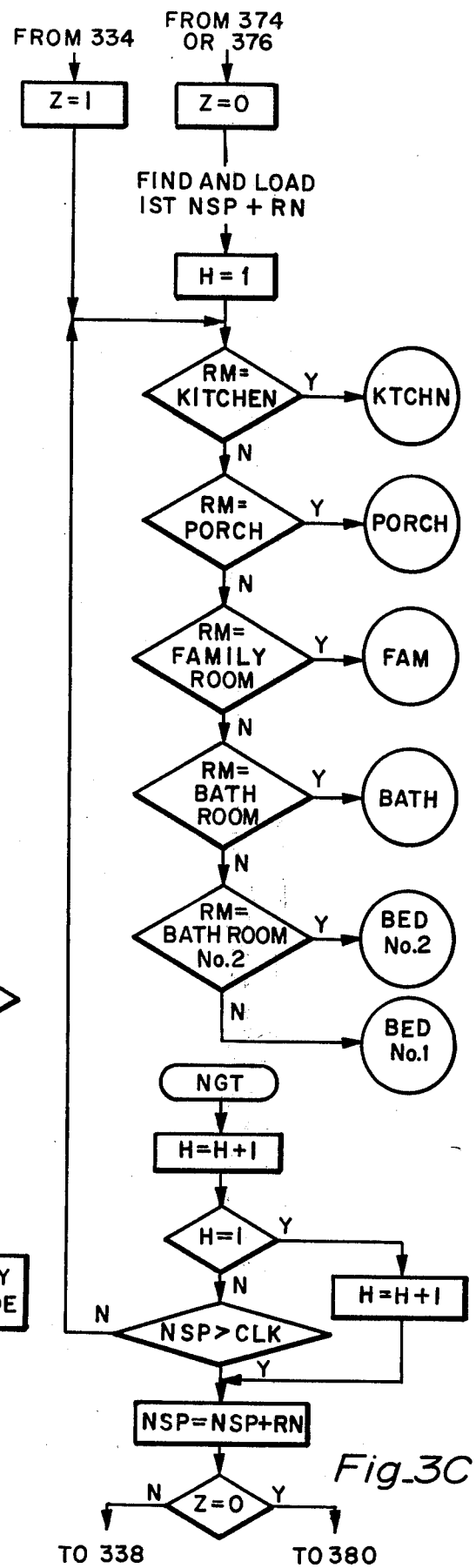
Fig_3C

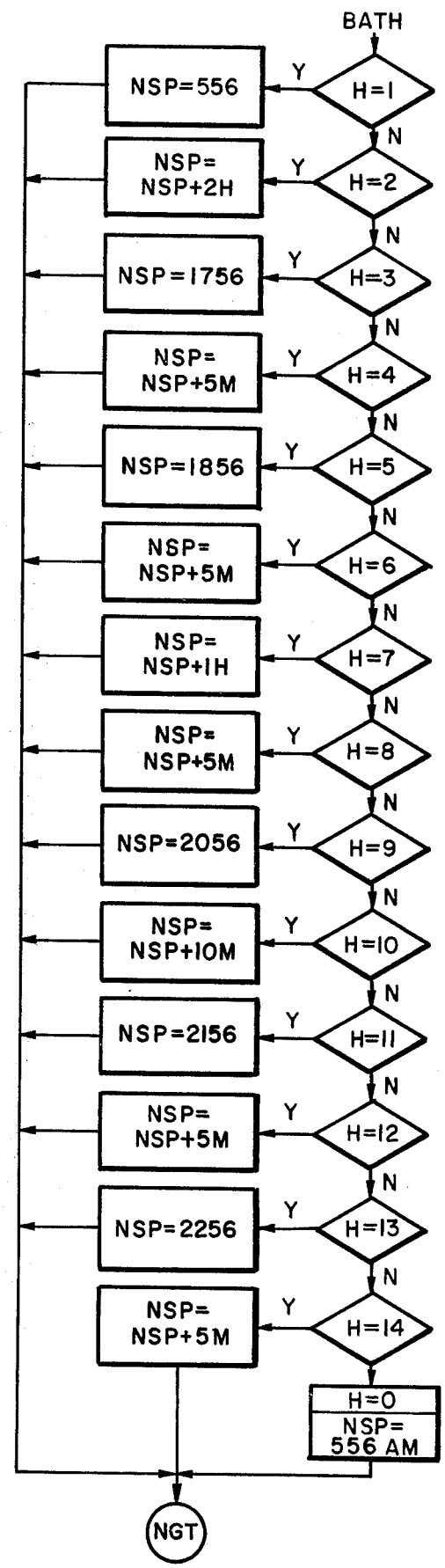
Fig_3E

| | | |
|---|---|---|
| A | 0=DEACTIVATE  1=ACTIVATE | FLAGS |
| E | 1=TIME OR ROOM HAS CHANGED | |
| F | 1=POS. TRANSITION OF "ON-OFF" | |
| G | 0=LIGHT ON  1=LIGHT OFF | |
| H | LSB= ON/OFF STATUS | |
| K | 0=2 SEC  1=1 SEC | |
| M | 0=HOUR INC  1=MIN INC | |
| P | 0=INITIALIZATION  1=RUN | |
| R | 1=DISPLAY ROOM CODES | |
| S | TEMP. ACTIVATE FLAG | |
| T | 1=POS. TRANSITION OF TIME & ROOM | |
| TM | TEST MINUTES FLAG | |
| TH | TEST HOURS FLAG | |
| Z | RETURN FLAG  = 0 RTN TO F4   = 1 RTN TO H | |
| CLK | 24 HOUR REAL-TIME CLOCK (8 BCD DIGITS) | VARIABLES |
| PM | 1 = PM   0 = AM | |
| CTR | TIME-OUT COUNTER (8 BITS) | |
| DISP | DISPLAY REGISTER (4 BCD DIGITS) | |
| H | VALUE REPRESENTS # OF ON-OFF'S TRANSITIONS FROM 1 AM | |
| NSP | NEXT STORED PATTERN (4 BCD DIGITS) | |
| RM | ROOM POINTER   1-bl  3-b  5-0   4-F  6-C | |
| RN | RANDOM NUMBER | |

| | F | E | D | C | B | A | 9 | 8 | 7 | 6 | 5 | |
|---|---|---|---|---|---|---|---|---|---|---|---|---|
| r = 0 | F | K | G | DISP 3 | DISP 2 | DISP 1 | DISP 0 | | | S | R | |
| 1 | A | Z | | HR H | HR L | MIN H | MIN L | SEC H | SEC L | 1/60 H | 1/60 L | |
| 2 | E | M | H | HR H | HR L | MIN H | MIN L | | 1/60 H | 1/60 L | RN | |
| 3 | P | T | PM 8 | TH 8 | TM 8 | | | | | | RM | |

DISP columns (C–9): D8 D7 D6 D5 — DISPLAY
Row 1: HR..1/60 L — CLK; SWITCHES TS OR S 8421
Row 2: HR..MIN L — NSP (NEXT STORED PATTERN); 1/60 H, 1/60 L — CTR

REGISTER MAP

Fig. 3F

LOAD CONTROL APPARATUS

BACKGROUND OF THE INVENTION

1. Field of the Invention

The present invention relates generally to switches and more particularly to automatic time switches which are operable in a two wire installation.

2. Description of the Prior Art

Considerable power is wasted when lights are left on needlessly. A frequent source of such waste is in offices in which lighting is inadvertently left on over night or worse, over the weekend.

Often times lights are purposely left on 24 hours a day to make a building appear occupied and thus discourage burglars. Twenty-four hour operation, however, not only wastes considerable energy during daylight hours, but can, in and of itself indicate that the building is unoccupied since most lighting is turned off during the day and very late at night. Further, when residential lighting is on, it is usually on only intermittently.

Prior art timing devices exist which can sequence a load such as turning a table lamp on and off at preset times. Most commonly, these devices are electromechanical in nature utilizing a clock type motor to trip a switch at one or more preset times.

Although useful for controlling table lamps and the like, common wiring practice often makes the use of these prior art timing devices for controlling the main lighting impractical. When a wall switch is connected in series with a ceiling light between the hot and neutral wires of the AC line, under common wiring practices, only two wires need be run to the switch. Since the second AC power line is usually not available at the switch location, without rewiring, prior art timing devices which require both AC lines to operate the clock motor may not conveniently be used to replace the wall switch.

Additionally, these prior art timing devices typically do not provide a convenient means for manually controlling the operation of the light in the traditional fashion.

SUMMARY OF THE PRESENT INVENTION

It is therefore a principle object of the present invention to provide an improved load control apparatus which reduces the power consumed by a light.

Another object of the present invention is to provide an improved load control apparatus which may be used to replace a conventional switch in a two wire installation.

Briefly, a preferred embodiment of the improved load control apparatus in accordance with the present invention suitable for replacing a traditional wall switch in a two wire installation includes a coupler responsive to a command signal and operative to alternately switch between a first state in which a current flow between the two wires sufficient to cause a noticable light bulb illumination is prevented and a second state in which substantially unlimited current flow between the two wires is permitted, a power supply for developing a power supply potential and a series of 60-Hz clocking pulses from energy obtained from the two wires regardless of the state of the coupler and a control logic powered by the power supply potential, for counting the clocking pulses and developing at preset time, the coupler command signal.

A principal advantage of the present invention is that it may be used to replace a traditional wall lighting switch without requiring rewiring.

The power savings made possible by the present invention is another material advantage thereof.

Other advantages of the present invention include its convenience of operation and its reliability. These and other objects and advantages of the present invention will no doubt become apparent to those skilled in the art after having read the following detailed description of the preferred embodiment illustrated in the several figures of the drawing.

IN THE DRAWING

FIGS. 3A–3E are logical flow charts illustrating various operational steps undertaken in controlling an electric load;

FIG. 3F is a table of flags and variables and a register map for use with FIGS. 3A–3E.

DETAILED DESCRIPTION OF THE PREFERRED EMBODIMENT

Figure 1:
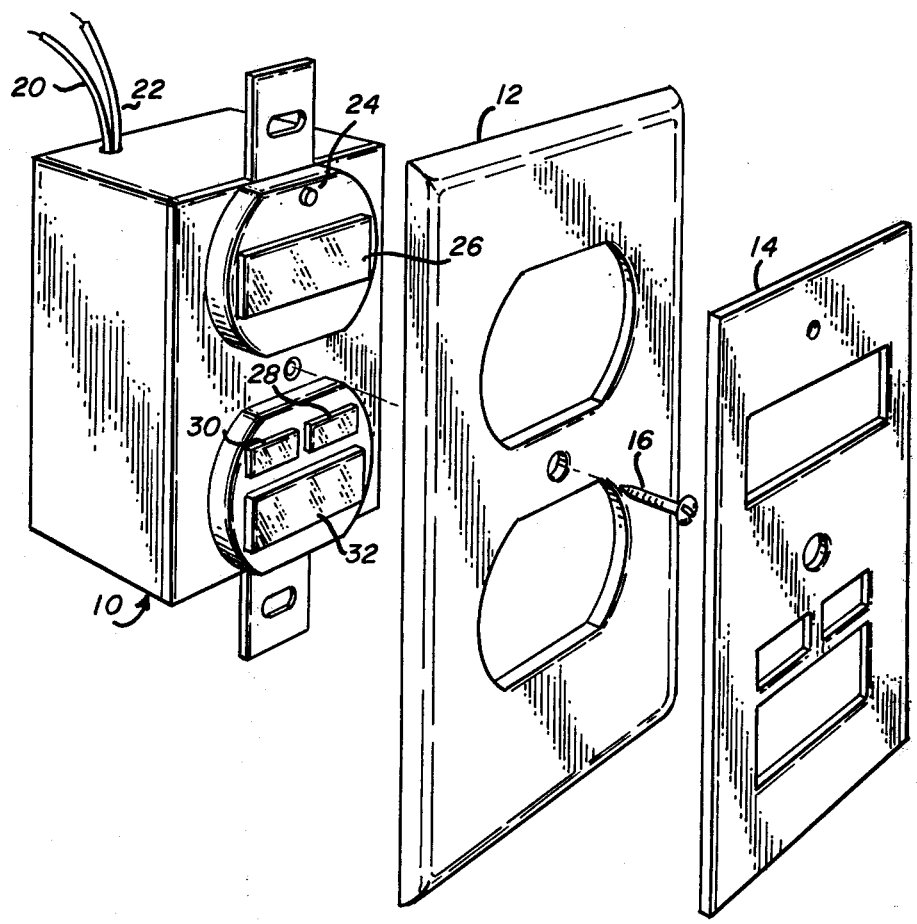
FIG. 1 is an exploded perspective view generally illustrating an improved load control apparatus in accordance with the present invention.

Illustrated in FIG. 1 of the drawing is a perspective view of an improved load control apparatus 10 suitable for installation in a wall mounted conventional outlet or switch box to replace a traditional wall switch. When installed, the device may be covered by a standard wall socket plate 12 and decorative front panel 14, the plate being retained in position by a screw 16 and the panel adhesively bonded thereto to provide a practical and pleasing appearance.

The apparatus is compatible with a two wire installation in which the electrical interconnection of the first and second wires completes a path necessary to power a remotely located load such as a light bulb. Most often, such wires are connected directly to an on/off switch which performs the interconnecting function.

For connection to these first and second wires, the apparatus 10 includes a pair of wires 20 and 22. The apparatus further includes a master disconnect switch 24, a ligh emitting diode (LED) display 26, a time control switch 28, a room control switch 30, and a light on/off control switch 32.

The apparatus obtains, through the two wires, its required operating power and develops 60-Hz timing pulses. By counting the timing pulses, the apparatus keeps track of the current time of day which it displays on LED display 26. The apparatus further compares the instant time with one of several prestored sets of times. When a match is found the apparatus is operative to develop a low or high impedance path between the two wires 20 and 22 as is necessary to tun the light bulb on or off, respectively.

Master disconnect switch 24 permits the connection of the device with the two wires to be interrupted for safety reasons. Calibration of the time readout may be made using the time control switch 28, and the selection of a set of preset times for lighting control appropriate with the room in which the apparatus is in installed, may be accomplished using the room control switch 30.

Additionally, the light on/off switch 32 enable manual operation of the light bulb.

Figure 2:
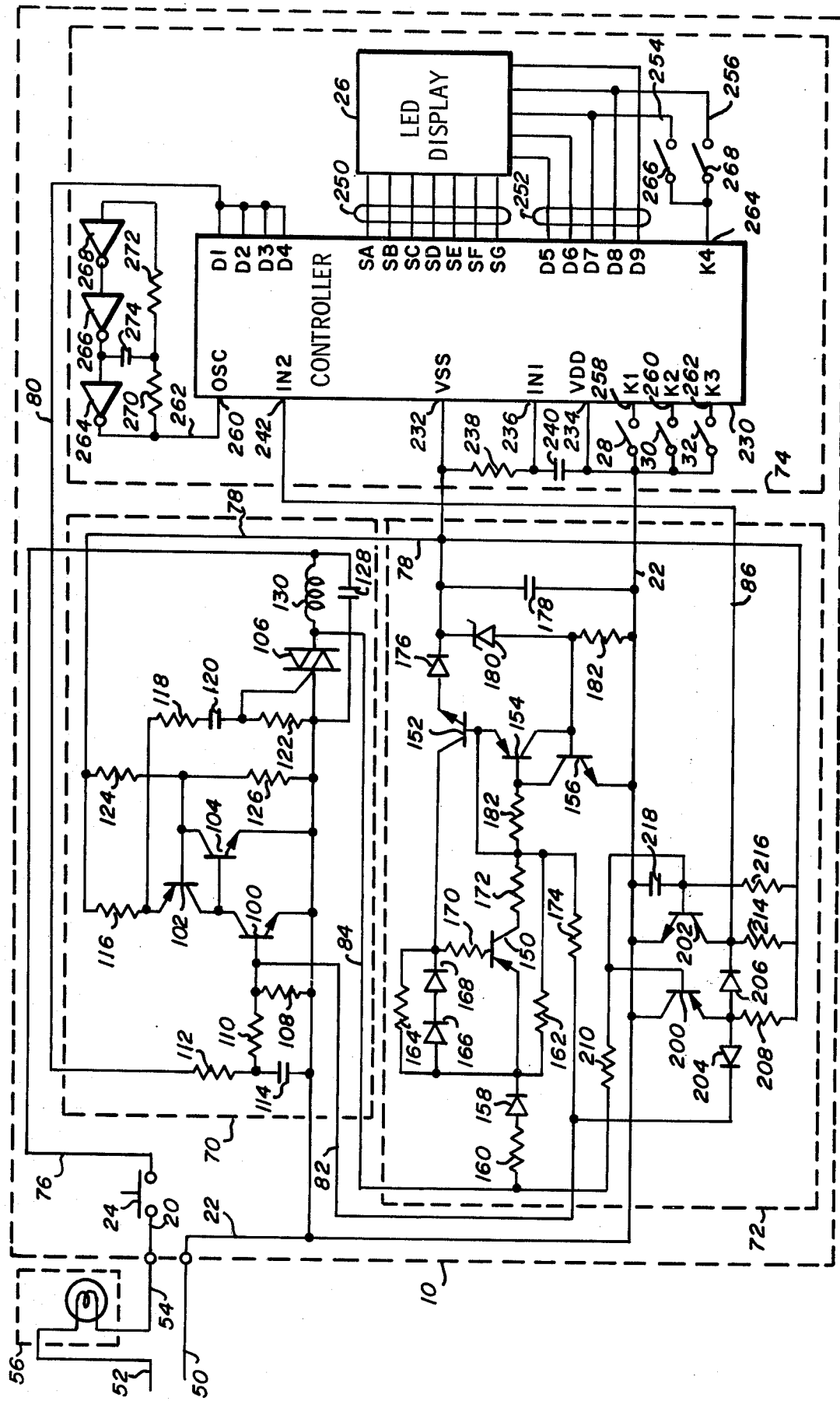
FIG. 2 is a schematic diagram further illustrating the improved load control apparatus shown in FIG. 1.

Turning now to FIG. 2, a schematic diagram of the preferred embodiment of the improved load control apparatus 10 is shown illustrating the device connected between a line 50 of two AC power lines 50 and 52 and a line 54 which is connected by a load 56, shown here as a light bulb, to line 52. The principle components of the load control apparatus include the master disconnect switch 24, a coupler 70, a power supply 72 and a control logic 74. Master disconnect switch 24, which is connected between line 20 and a line 76 is operative to interrupt the connection of the load control apparatus with line 54 to reduce the chance of a shock hazard which might otherwise exist when light bulb 56 is being replaced.

Coupler 70, when powered by a power supply potential developed on a line 78 with respect to line 22, is responsive to a command signal developed on a line 80 and a timing signal developed on a line 82 and operative to control the flow of current between lines 76 and 22. The coupler also provides a degree of filtering for signals on line 76 before they are connected by the coupler to a line 84 for routing to power supply 72.

Power supply 72, when suitably connected by switch 24 and light bulb 56 to the AC power source, develops on line 78 with respect to line 22 a 9-volt DC power supply potential which it derives from the signals generated between lines 84 and 22. In this embodiment the power supply develops a timing signal on line 82 which is used to reset the coupler and control its timing as necessary to derive the power supply potential. The power supply further uses the signals generated between lines 84 and 22 to develop a 60-Hz timing, or clocking signal on a line 86.

Control logic 74 is powered by the 9-volt DC potential developed on line 78 with respect to line 22 and is operative to count the clocking pulses developed on line 86. At appropriate times, as indicated by the sum of the clocking pulses, the control logic is operative to develop a high or low signal level on control line 80 to prevent or permit coupler 70 from energizing the light bulb.

Coupler 70 includes as active components three transistors 100, 102 and 104 and a triac 106. NPN transistor 100 has a base which is connected to line 82, by a biasing or pull down resistor 108 to line 22, which serves as a reference line, and by the series combination of a summing resistor 110 and a filter resistor 112 to line 80. The juncture of resistors 110 and 112 is connected to reference line 22 by a filter capacitor 114. Transistor 100 also has an emitter which is connected to line 22 and a collector which is connected to the base of transistor 104 and the collector of transistor 102.

PNP transistor 102 and NPN transistor 104 are connected in an SCR, or latch, configuration. The emitter of transistor 102 is connected by an emitter biasing and charging resistor 116 to the positive power supply line 78 and by the series conbination of a charging resistor 118, a time constant capacitor 120 and a gate biasing resistor 122, to reference line 22. The emitter of transistor 104 is connected to line 22, and the base of transistor 102 and the collector of transistor 104 are connected to a reference potential developed at the juncture of a voltage divider consisting of a pair of resistors 124 and 126 connected between line 78 and line 22.

Triac 106 has a gate connected to the juncture of capacitor 120 and resistor 122 and a first main terminal connected to line 22 and by a filter capacitor 128 to line 76. The triac also has a second main terminal which is connected to line 84 and by a filter inductor 130 to line 76.

In order to describe the operation of controller 70 it is assumed that initially all three transistors are off and that a charging current is flowing through resistors 116 and 118, into capacitor 120. Thereafter, as capacitor 120 charges, the potential at the emitter of transistor 102 will increase to a level sufficiently high to cause its conduction and the resultant conduction of transistor 104. As transistor 102 and 104 begin conduction, they discharge capacitor 120 through resistor 122 developing a negative triac actuating signal at the gate thereof. Thereafter, transistor 102 and 104 will continue to conduct until reset by the conduction of transistor 100.

A sufficiently high positive potential developed on either or both of lines 80 and 82 will cause the conduction of transistor 100 resetting transistors 102 and 104, and again permits the charging of capacitor 120. As long as transistor 100 is maintained in conduction, conduction of transistor 104 will be prevented, delaying the actuation of the triac even though capacitor 120 has charged to the transistor 102 conduction level.

As indicated earlier, a high signal level is developed on line 80 at those times when energization of light bulb 56 is to be prevented. A high signal level is developed on line 82 coincident with zero crossings of the 60-Hz signal generated between lines 76 and 22 in order to reset the coupler and thus enabling it to respond to the next 60-Hz half cycle. A high signal level is further developed on line 82 to delay the actuation of the triac as necessary for power supply 72 to develop the power supply potential.

A first portion of power supply 72, which is primarily responsible for developing the 9-volt power supply potential, includes as active components four transistors 150, 152, 154 and 156. PNP transistor 150 and NPN transistor 152 are connected in a modified SCR, or latch, configuration. Transistor 150 has an emitter which is connected by the series combination of a rectifying diode 158 and a current limiting resistor 160 to line 84 for receiving the 60-Hz potential generated on line 76 and thus line 84 with respect to line 22. The emitter of transistor 150 is also connected by a biasing resistor 162 to the base of transistor 152 by a base pull-down resistor 164 to the collector of transistor 152 and by the series combination of two current shunting and biasing diodes 166 and 168 to the collector of transistor 152. The base of transistor 150 is connected by a base current limiting resistor 170 to the collector of transistor 152, and the collector of transistor 150, is connected by a current limiting resistor 172 to the base of transistor 152.

The base of transistor 152 is also connected to the emitter of transistor 154 and by gating resistor 174 to line 82. The emitter of transistor 152 is connected by a steering diode 176 to line 78 which is connected to the reference line 22 by a filter capacitor 178 and by the series combination of an 8.5 volt zener diode 180 and a base pull down resistor 182.

PNP transistor 154 and NPN transistor 156 are connected in an SCR, or latch, configuration. The base of transistor 154 is connected by a base pull down resistor 182 to its emitter, and the base of transistor 156 is connected to the juncture of zener diode 180 and resistor 182. The emitter of transistor 154 is connected to the base of transistor 152, and emitter of transistor 156 is connected to line 22.

For discussion it is assumed that an AC potential is being developed between line 84 and line 22. Such is the case when the apparatus is connected across a source of AC potential by a light bulb, switch 24 is closed and coupler 70 is not conducting current between line 76 and 22.

It is further assumed that initially transistors 150, 152, 154 and 156 are all off, which will occur during a negative half cycle of the AC potential developed on line 84 with respect to line 22 when the potential across capacitor 178 is less than 9 volts.

During the next positive half cycle, when the potential generated on line 84 exceeds the potential developed across capacitor 178 by three diode drops, a current will flow through resistor 160 diode 158 and resistor 162 into the base of transistor 152 causing conduction thereof. Next, conduction of transistor 152 causes a base current to flow out of the base of transistor 150 turning it on which maintains the conduction of transistor 152. While transistors 150 and 152 are on, a large current will flow through resistor 160, diodes 158, 166 and 168, transistor 152 and diode 174, charging capacitor 178.

When the potential developed across capacitor 178 exceeds 9 volts, zener diode 180 will develop a potential across resistor 182 sufficient to cause the conduction of transistor 156 and the resulting conduction of transistor 154. Until reset, transistors 154 and 156 lower the potential at the base of transistor 152 turning off transistors 152 and 150. Transistors 154 and 156 will continue to conduct until reset, which occurs during the next half cycle of the AC potential developed on line 84 if the potential across capacitor 178 drops below 9 volts.

During the time that transistors 150 and 152 are on, and thus charging capacitor 178, transistors 154 and 156 are off. During this time a high signal level is developed at the base of transistor 152 and thus on line 82 preventing coupler 70 from shorting line 76 to line 22 as necessary to permit the proper operation of the power supply. After capacitor 178 is properly charged causing conduction of transistors 154 and 156, and on negative half cycles, a low signal level is developed at the base of transistor 152 permitting normal operation of the coupler.

It will be noted that the charging of capacitor 178, as described above, usually occurs during a small fraction of the positive half cycle of the AC wave form, when the potential on line 84 with respect to line 22 is between approximately 10 and 20 volts. It has been found that when coupler 70 is on but for this brief period, no substantial drop in the illumination generated by light bulb 56 is noticed.

It will be further noted that the average current flow through line 84 is substantially equal to that required from the power supply to operate the apparatus. This current is so small that when coupler 70 is off no noticeable illumination of light bulb 56 occurs.

The timing portion of power supply 72 includes as active components two transistors 200 and 202. PNP transistor 200 has an emitter which is connected to line 82 by a first steering diode 204 to the collector of transistor 202 by a second steering diode 206 and to the positive power supply line 78 by an emitter resistor 208. Transistor 200 also has a collector which is connected to reference line 22 and a base which is connected by current limiting resistor 210 to line 84.

The collector of NPN transistor 202 is also connected to line 86 and to line 78 by a collector resistor 214. The emitter of transistor 202 is connected to line 22, and the base of transistor 202 is connected to the base of transistor 200, to line 78 by a biasing resistor 216 and to line 22 by a filter capacitor 218.

In response to a 60-Hz signal generated on line 84, transistor 202 is operative to conduct on positive half cycles of the signal and transistor 200 is operative to conduct on negative half cycles of the signal. Transistor 202 thus develops a 60-Hz square wave on line 86 suitable for driving control logic 74.

When transistor 202 conducts the current flowing through resistor 208 and diode 206 clamps the emitter of transistor 200 at a low signal level, and when transistor 200 conducts it clamps its emitter at a low signal level. Thus, there is generated at the emitter of transistor 200 a signal consisting of narrow pulses which are only at a high signal level coincident with zero crossings of the 60-Hz signal generated on lines 84 and 76. These pulses cause the conduction of transistor 100 which resets transistors 102 and 104 as necessary to permit generation of the next triac gating pulse and to synchronize it with the 60-Hz zero crossings.

Resistor 216 is operative with resistor 210 to develop a bias voltage which controls the timing of the conduction of transistor 202 and thus the width of the pulses. Capacitor 218 filters noise developed on line 84 to prevent false triggering.

Preferably, control logic 74 includes as an active component a controller 230 such as the MOS controller oriented processor designated 57140 and manufactured by National Semiconductor. The controller includes a first power supply input terminal 232 connected to line 78, a second power supply input terminal 234 connected to reference line 22 and a power-on-reset terminal 236 connected to line 78 by a biasing and time constant resistor 238 and to line 22 by a time constant capacitor 240. A general purpose input 242, is connected to line 86 for receiving the 60-Hz clocking pulses.

Four digit driver output lines of controller 230, which are connected in parallel, are connected to line 80.

Seven, 7-segment driver lines are connected by a bus 250 to the 7-segment LED display 26. Also connected to display 26, by a bus 252, which includes a line 254 and a line 256, are five digit driver outputs of controller 230. The display includes four, 7-segment digits and a colon digit, suitable for displaying the time of day in an hour and minute format.

Three keyboard scanning inputs 258, 260 and 262 are connected to reference line 22 by the time control switch 28, the room control switch 30 and the on/off control switch 32, respectively. A fourth keyboard scanning input 264 is connected by a first calibration switch 266 to line 254 and by a second calibration switch 268 to line 256.

Controller 230 may be operated with either an internal or external oscillator, or clock. In this embodiment control logic 74 is illustrated with an oscillator, or clock, input 260 of the controller connected by a line 262 to an optional oscillator. The oscillator includes three series connected NOR gates 264, 266 and 268 which function as inverters. A pair of series connected resistors 270 and 272, connected across the gates, and a capacitor 274, connected between the juncture of the resistors and the input of gate 264, are operative to develop a feedback signal suitable for causing oscillation of the gates.

When powered by a 9-volt DC potential developed between terminal 232 and terminal 234, controller 230 is operative to count the 60-hertz clocking pulses which are developed on line 86. The pulses are counted to arrive at a sum signal indicative of the current time of day. In the normal mode, this sum or time of day signal is used to generate multiplexed, 7-segment LED driving signals, including the segment driving signals on bus 250 and the digit driving signals on bus 252 to drive display 26. Responsive to these driving signals, display 26 is operative to display the current time of day.

Controller 230 is also operative to compare the displayed time with a set of preset time signals. When a match is found, the controller is operative to change the state of the logic level signal developed on line 80 as is appropriate to turn the light on or off.

Controller 230 is additionally responsive to the closure of the light on/off control switch 32 and operative to generate an appropriate logic level signal on line 80, permitting manual operation of the light.

Switches 28 and 30 permit user adjustment of the apparatus. A first closure of the time control switch 28 causes controller 230 to increment the time of day display by one minute each second, and a second closure of switch 28 causes controller 230 to increment the hours portion of the time of day display once each second permitting calibration of the time being displayed.

Closure of room control switch 30 causes controller 230 to cycle through the several sets of preset time signals. While controller 230 is cycling through different sets of time signals, the controller causes display 26 to display an appropriate letter. For example, coincident with the set of time signals appropriate for the operation of a bathroom light a "b" is displayed; for a first bedroom or sleeping room light a "b1" is displayed; for a family or living room, an "F" is displayed; for outside porch lights an "O" is displayed; and for cooking or kitchen light a "C" is displayed.

Switches 266 and 268 are provided as an aide in testing and servicing. Closure of switch 266 causes the apparatus to operate at a sixty times increased rate and the closure of switch 268 causes an additional sixty fold increase in the operative rate.

The operation of the improved load control apparatus may be better understood with additional reference to FIG. 3A. Following a power failure, or an initial installation, it is necessary to recalibrate the time read-out. Until this is accomplished, the apparatus operates in an initialization mode in which it causes the LED display 26 to flash the time read-out on and off. More specifically, when power is initially restored, capacitor 240 momentarily develops a low logic level at the power-on-reset terminal 236 causing controller 230 to reset, or zero all registers. This step is illustrated in FIG. 3A by a block 300. After the controller sets a room register to correspond to a first bedroom illustrated by a block 302, it monitors the signal at the 60-Hz clocking pulse input terminal 242 for a low logic level at 304.

During the low logic level portion of the clocking pulse the controller develops on buses 250 and 252 the proper signal levels to cause display 26 to display the information previously stored in a display register, as illustrated at 306 and 308. Since this register was reset during the power-on-reset, zeros will be displayed.

Following the low-to-high transition of the clocking pulse, the controller examines a light control register to determine whether the light should be on or off illustrated at 310. Since this register was similarly reset, the controller develops a low logic level at the outputs connected to line 80 causing the energization of light 56, as illustrated by a block at 312.

Then the controller increments a clock register by one-sixtieth of a second at 314, and scans the signal levels developed at terminals 258, 260, and 262 to permit the detection of the closure of the time control switch 28, the room control switch 30 or the light on/off control switch 32. Since calibration of the device requires the closure of either the time switch or the room switch, it is assumed, for the discussion, that such a closure has not been detected so that following testing at 318 and 320 the controller will immediately proceed to test two previously reset flag registers at 322 and 324.

Unless a test at 326 indicates the light on/off switch 32 has been depressed, a light switch transition flag register, which was also reset, is again reset at 328. Because the response of the controller to the closure of the light on/off switch is similar after initialization as before, discussion of this feature is deferred.

Next, the controller compares the clock register with a next stored pattern register as illustrated at 330. Since the clock register was incremented at 314, the registers do not correlate.

Finally, the controller loads the display register with the contents of the time register at 332, and returns to monitor the 60-Hz clocking pulse terminal 242 for the remainder of the high logic level portion of the current pulse, illustrated at block 304.

Coincident with each of the subsequent clocking pulses developed at terminal 242, until the closure of the time control switch 28, the room control switch 30 or the on/off control switch 32 is detected, the controller continues to repeat the above steps to the step illustrated at 330. Should sufficient time elapse such that the contents of the clock and next stored pattern registers correlate, since the device has not been actuated as ascertained at 334, the controller will then obtain a new quasi-random number at 336 and a new next stored pattern at 338 before loading the display at 332. During alternate seconds, the display register is loaded with the contents of the time register and blanks.

Initialization is accomplished by recalibrating the time read-out, the room code, or both. The first closure of the time control switch 28 causes the controller to increment the time read-out by one minute each second, and the second closure of switch 28 causes the controller to increment the time read-out by one hour each second. Closure of the room control switch 30 causes the controller to switch room codes at a one-second rate while driving LED display 26 with signals appropriate for displaying the current room code.

More specifically, following the first detection of the closure of either the time control or room control switch illustrated at block 316 and the subsequent branch and 318 or 320, and after finding that the first time or room switch transition detection register has been reset at 350, the controller will set this register equal to one. The controller will also set a temporary flag register S equal to one, compliment a minute/hour flag register M and reset a rate counter CTR at 352. Since a second time or room switch transition detection register E is still equal to zero at 324, the controller proceeds throughout the rest of the cycle as before.

On second and subsequent cycles, as long as the switch remains closed and until counter CTR reaches a preset count at 356 which is selected to provide approximately one second of delay, the controller will increment the counter at 354 and continues throughout the remainder of the cycle as before.

When counter CTR reaches the preset count at 356, the controller resets the temporary flag register S, sets the second switch transition register E, and an initialization/run register P equal to one (run) and resets counter CTR at 358. Next, if it was the room control switch 30 which was depressed, at 360 the controller will set a flag register R at 362 causing the room control counter letter to be displayed and increment the room control counter RM at 364.

If, on the other hand, it was the time control switch 28 which was depressed, at 360 the controller, based on the minute/hour flag register M, at 266 will increment the hours portion at 368 or the minutes portion at 370 of the time register. During the next cycle, after ascertaining that the T flag register is equal to one at 350, incrementing at 354 and testing at 356 the previously reset counter CTR, the controller tests at 324 and then resets at 372 the E flag register. If the bathroom code has been selected, the controller will branch at 374 to reduce the magnitude of the next random number by a factor of two at 376. It will then obtain the next, next stored pattern which is greater than the current time for the selected room at 378 and reset appropriate flag registers at 380 and 382.

As long as the switch is depressed, the controller will continue in this fashion incrementing the counter to its limit at 354, and, when the limit is reached, increment the room code at 364 or appropriate portion of the time register at 368 or 370 and obtain an appropriate new next stored pattern at 378. During the first cycle following release of the switch, since the first switch transition flag register T is still equal to one at 322, the controller will reset the first transition flag register T, the display room code flag register R, and the counter CTR.

The device is activated by depressing either the time control switch 28 or the room control switch 30 for less than one second as indicated at 350 and 384. (The device is thus deactivated by depressing either switch longer than one second.) After activation, whenever the clock register is equal to the next stored pattern at 330, the controller will change as appropriate the state of the light on/off register G at 386, to cause the state of the light to be changed at 312 or 390 prior to obtaining a new random number at 334, and a next, next stored pattern at 336.

Closure of the light on/off control switch 32, when detected by the controller at 316 and 326, causes the controller to test a third switch transition flag register F at 392 which was previously reset. During the first cycle following closure of the on/off switch, the controller sets the F flag equal to one at 394 and changes the state of the light on/off register at 396. On subsequent cycles the third switch transition register F is reset, rendering the controller responsive to further closures of the switch.

Additional details of the steps performed in incrementing the clock at 314, obtaining a next, next stored pattern at 378 and 336 and loading the display register at 338 are shown in FIGS. 3B, 3C and 3D, respectively. Stored patterns suitable for use in controlling a bathroom light are illustrated in FIG. 3E, and a resistor map is shown at 3F.

Figure 4:
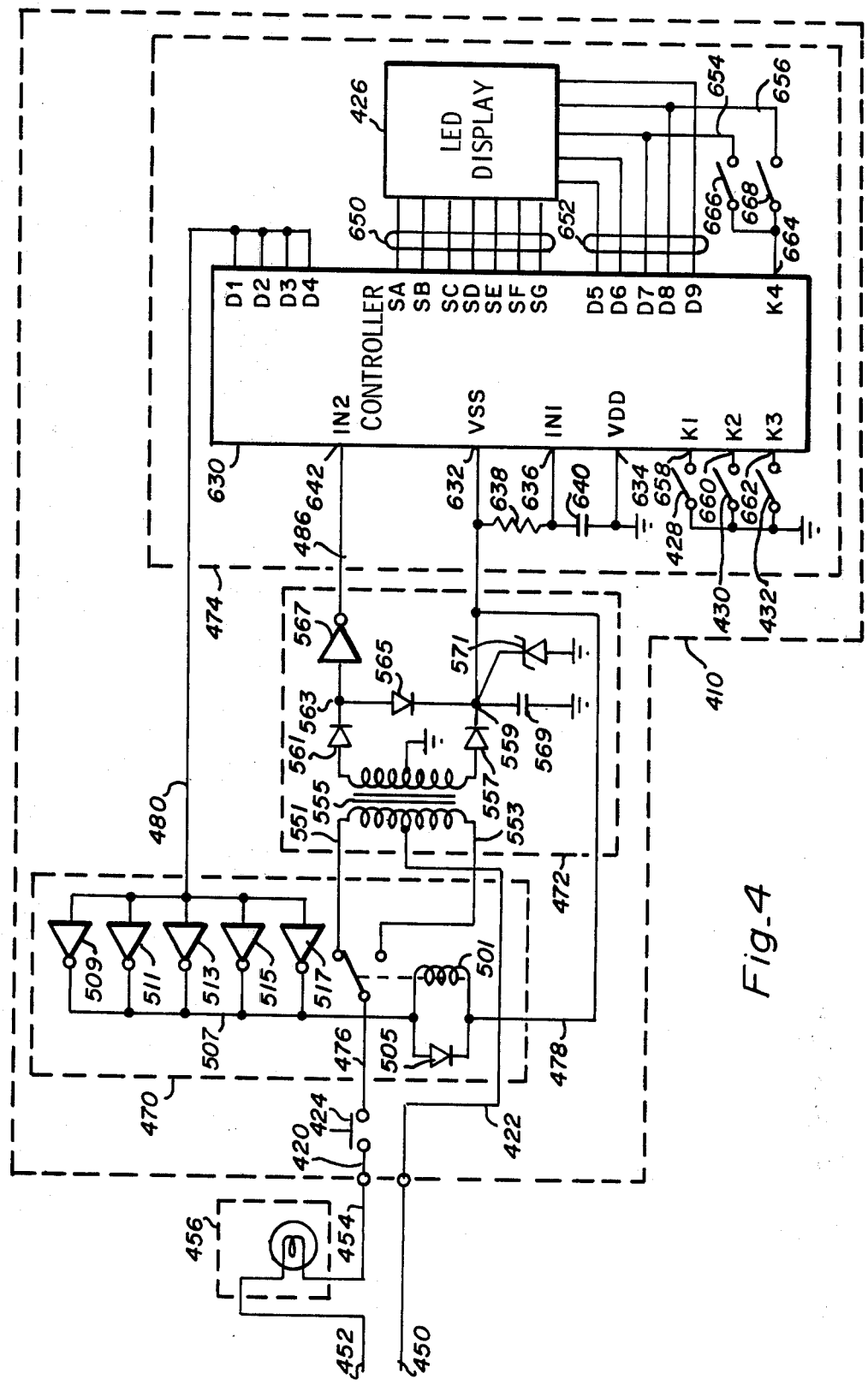
FIG. 4 is a schematic diagram illustrating an alternative embodiment of an improved load control apparatus in accordance with the present invention.

Turning now to FIG. 4, a schematic diagram of an alternative embodiment of the improved load control apparatus is shown at 410. The apparatus is connected between a line 450 of two AC power lines 450 and 452, and a line 454 which is connected by a load 456, depicted as a light bulb, to line 452. The principal components of this embodiment include a master disconnect switch 424, similar to switch 24, a coupler 470, functionally analogous to coupler 70, a power supply 472 functionally analgous to power supply 72, and a control logic 474, similar to control logic 74. Master disconnect switch 424, which is connected between a line 420 connected to line 454 and a line 476, permits the connection of the load control apparatus with line 454 to be interrupted.

Coupler 470 includes a relay 501 having a coil the first end of which is connected to a power supply line 478 and to the second end of the coil by a transient suppression diode 505. The second end of the coil is also connected by a line 507 to five parallel connected inverters 509, 511, 513, 515 and 517 which are connected to a control line 480.

The relay is responsive to a 9-volt signal developed between lines 478 and 507, and operative to interconnect either a line 553 or a line 551 with line 476. The inverters are operative to invert and current-amplify the signal developed on line 480 as required by the relay, and diode 505 is operative to protect the inverters from the transient potential generated by the collapsing magnetic field associated with the relay coil.

Power supply 472 has a high impedance power input which is connected between a line 422 and line 551, and a low impedance power input which is connected between lines 422 and 553 for an alternative relay selectable series connection by a 70-to-300 watt electric light bulb, or other load to an AC power source. The inputs are such that the series connection of the high impedance input and the light bulb across the AC power source causes a small fraction of the rated power to be dissipated in the light. The low impedance input, when series connected with the light to the AC line, permits all by a simlarly small fraction of the rated AC power to be dissipated in the light. In other words, depending on the power supply input used, the light bulb will be essentially on or off.

The power supply, when suitably connected by the light bulb to the AC power source, develops a 9-volt DC potential on the power supply line 478 and 60-Hz clocking pulses on a line 486, both with respect to circuit ground.

The power supply includes a saturable transformer 555 having a high impedance primary winding and a low impedance primary winding. The high impedance primary winding is wound to operate with substantially a 110-volt potential connected thereacross while drawing negligible current. The low impedance primary winding is wound to have a negligible voltage drop thereacross when connected in series with the 70-to-300-watt light bulb, both being connected across the AC line.

Saturable transformer 555 has a center tapped secondary winding. A first end of the secondary winding is connected by a rectifying diode 557 to a node 559 which is connected to line 478. A second end of the secondary winding is connected by a first rectifying and steering diode 561 to a node 563 which is connected by a second rectifying and steering diode 565 to node 559, and by an inverter 567 to line 486. The center tap of the secondary winding is connected to circuit ground. Connected from node 559 to circuit ground is a filter capacitor 569 and a 9-volt zener diode 571.

When either the high or low impedance primary winding of saturable transformer 555 is properly connected to a source of AC power, power supply 472 develops a 9-volt DC potential on line 478 and develops on line 486, 60-Hz clocking pulses derived from the 60-Hz AC line. Inverter 567 is operative to shape the clocking pulses as required by the control logic.

Control logic 474 is powered by the 9-volt potential developed on line 478 and is operative to count the clocking pulses developed on line 486. At appropriate times as indicated by the sum of the clocking pulses, the control logic is operative to develop a high signal level on line 480 causing the actuation of relay 501.

The control logic includes a controller 630, similar to controller 230, which is illustrated in this figure utilizing an internal oscillator or clock. The controller includes a first power supply input terminal 632 connected to line 478, a second power supply input terminal 634 connected to circuit ground and a power-on-reset terminal 636 connected to line 478 by a biasing and time constant capacitor 640. A general purpose input 642 is connected to line 486 for receiving the 60-Hz clocking pulses developed by power supply 472.

Four digit driver output lines of controller 630 which are connected in parallel are connected to a line 480. Seven 7-segment driver lines are connected by a bus 650 to a 7-segment LED display 426 which is similar to display 26. Also connected to display 426 by a bus 652, which includes a line 654 and a line 656, are five digit driver outputs of controller 630.

Three keyboard scanning inputs 658, 660 and 662 are connected to circuit ground by a time control switch 428, a room control switch 430 and an on/off control switch 432, similar to switches 28, 30 and 32, respectively. A fourth keyboard scanning input 664 is connected by a first calibration switch 666 to line 654 and by a second calibration switch 668 to line 656.

Controller 630 operates in a fashion similar to controller 230 discussed in connection with the previous embodiment. The controller is operative to count the 60-Hz clocking pulses which are developed on line 486, to derive the current time of day which is displayed on display 426 and at appropriate times generate a control signal on line 480 to change the state of light bulb 456.

Since an electric light bulb is presently envisioned as the preferred load, the preceding discussion has been with reference thereto. Obviously, the invention may be used to turn on and off at preset times any electrical load. The ability of the invention to replace a traditional electrical switch in a two-wire installation without requiring rewiring makes it particularly attractive in such installations.

The invention may also incorporate sensors to monitor other stimuli such as light and temperature to supplement or replace the 60-Hz clocking pulses for input to the controller.

Additionally, other modifications may be employed such as the use of an oscillator, particularly a crystal-controlled one, to develop the clocking pulses presently developed by the power supply. If such an oscillator and the controller are also connected to a trickle-charged battery, no recalibration following a power outage will be necessary.

It is contemplated that after having read the preceding disclosure other alterations and modifications of the present invention will no doubt become apparent to those skilled in the art. It is therefore intended that the following claims cover all such alterations and modifications as fall within the true spirit and scope of the invention.

What is claimed is:

1. An improved load control apparatus for controlling the operation of a load in a predetermined manner using power derived from current flowing through the load comprising:
   a first terminal for connection through the load to one of a pair of power conducting wires;
   a second terminal for connection to the other of said power conducting wires;
   a high impedance means connectable across said terminals to limit current flowing through said load to less than that required to operate said load in its intended manner;
   a low impedance means connectable across said terminals to allow normal operating current to flow through said load;
   switching means responsive to an actuating signal and operative to switch between a first state wherein said high impedance means is connected between said terminals and a second state wherein said switching means connects said low impedance means between said terminals;
   power supply means for developing a DC potential irrespective of the state of said switching means, said power supply means including said high impedance means and operative to develop said DC potential in response to current flowing therethrough; and
   actuating means powered by said DC potential, said actuating means being responsive to the occurrence of a first predetermined condition and operative to develop said actuating signal whereby said switching means is caused to switch to said first state and cause said load to become inoperative.

2. An improved load control apparatus as recited in claim 1 wherein said actuating means is further responsive to the occurrence of a second predetermined condition and is further operative to develop said actuating signal whereby said switching means is caused to switch to said second state and cause said load to become operative.

3. An improved load control apparatus as recited in claim 1 wherein said power supply means further develops a series of clocking pulses, wherein said power supply means further includes said low impedance means and operative to develop said DC potential in response to current flowing therethrough and wherein said actuating means includes logic means powered by said DC potential, said logic means being operative to count said clocking pulses and at a first preset time, as indicated by said count, to develop said actuating signal whereby said switching means is caused to switch to said first state and cause said load to become inoperative.

4. An improved load control apparatus as recited in claim 3 wherein said logic means at a second preset time is further operative to develop said actuating signal whereby said switching means is caused to switch to said first state and cause said load to become operative.

5. An improved load control apparatus as recited in claim 3 wherein said switching means includes a relay having:
   a first contact connected by said low impedance means to said second terminal;

a second contact connected by said high impedance means to said second terminal;

an armature connected to said first terminal; and a coil connected to said logic means whereby said relay is responsive to said actuating signal and operative to switch between said first and second states.

6. An improved load control apparatus as recited in claim 3 wherein said power supply means includes a saturable transformer having a first primary winding, a second primary winding, and a secondary winding and wherein said high and low impedance means include said first and second primary windings respectively.

7. An improved load control apparatus as recited in claim 6 wherein said power supply means further includes:

rectifying means connected to said secondary winding for developing said clocking pulses and a rectified signal; and filter means connected to said rectifying means, said filter means for receiving said rectified signal and for developing said DC signal.

8. An improved load control apparatus as recited in claim 3 wherein said logic means includes a controller oriented processor.

9. An improved load control apparatus as recited in claim 3, wherein said apparatus further comprises:

a housing suitable for disposition within an outlet box and for containing the previously enumerated components of the apparatus, said housing including a front panel;

a two-opening wall socket plate affixed to said panel, said plate having a first aperature and a second aperature;

a time switch disposed within said panel and extending through one of said aperatures in said plate, said time switch being connected to said logic means so as to permit adjustment of said count;

a room switch disposed within said panel and extending through one of said aperatures in said plate, said room switch being connected to said logic means so as to permit adjustment of said first preset time;

an on/off switch disposed within said panel and extending through one of said aperatures in said plate, said on/off switch being connected to said logic means so as to permit said actuating signal to be generated manually;

a disconnect switch disposed within said panel and extending through one of said aperatures in said plate, said disconnect switch for permitting the connection of one of said terminals and the corresponding one of said power conducting wires to be interrupted; and a display disposed within said panel, said display being responsive to said count and operative to generate a visual display of the current time of day observable through one of said aperatures in said plate.

10. An improved load control apparatus as recited in claim 1 wherein said switching means is further responsive to a control signal and operative to switch to said first state and wherein said power supply means is responsive to said DC potential and operative to generate said control signal when said DC potential is less than a predetermined level.

11. An improved load control apparatus as recited in claim 10 wherein said switching means includes:

a triac having a first main electrode connected to said first terminal, a second main electrode connected to said second terminal and a gate electrode, said triac including said low impedance means and responsive to a gate signal and operative to conduct the normal load operating current therethrough;

charging means for developing a charging signal;

first latch means responsive to an inhibit signal and operative to discharge said charging signal developing said gate signal; and transistor means responsive to said actuating signal and said control signal and operative to develop said inhibit signal.

12. An improved load control apparatus as recited in claim 10 wherein said power supply means includes;

a diode;

a capacitor;

second latch means connected between said terminals by said diode and said capacitor to form said high impedance means, said second latch means being responsive to a level signal and operative to charge said capacitor developing said DC potential; and third latch means responsive to said DC potential and operative to develop said level signal and said control signal when said DC potential is less than said predetermined level.

13. In a power system including a power source for developing a potential between a first and a second output, a load, and a load control apparatus having a pair of terminals including a first terminal connected through the load to the first output and a second terminal connected to the second output, an improved load control apparatus comprising:

a high impedance means connectable across the terminals to limit current flowing through the load to less than that required to operate said load in its intended manner;

a low impedance means connectable across the terminals to allow normal operating current to flow through said load;

switching means responsive to an actuating signal and operative to switch between a first state wherein said high impedance means is connected between said terminals and a second state wherein said switching means connects said low impedance means between said terminals;

power supply means for developing a DC potential irrespective of the state of said switching means including said high impedance means and operative to develop said DC potential in response to current flowing therethrough; and actuating means powered by said DC potential said actuating means being responsive to the occurrence of predetermined condition and operative to develop said actuating signal whereby said switching means is caused to switch to said first state and cause said load to become inoperative.

* * * * *